(12) United States Patent
Hoya

(10) Patent No.: US 9,236,104 B2
(45) Date of Patent: *Jan. 12, 2016

(54) SEMICONDUCTOR STORAGE DEVICE

(71) Applicant: KABUSHIKI KAISHA TOSHIBA, Tokyo (JP)

(72) Inventor: Katsuhiko Hoya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/334,547

(22) Filed: Jul. 17, 2014

(65) Prior Publication Data

US 2014/0328118 A1    Nov. 6, 2014

Related U.S. Application Data

(63) Continuation of application No. 13/421,505, filed on Mar. 15, 2012, now Pat. No. 8,804,409.

(30) Foreign Application Priority Data

Mar. 23, 2011    (JP) ................................ 2011-064083

(51) Int. Cl.
*G11C 11/00* (2006.01)
*G11C 11/16* (2006.01)
(Continued)

(52) U.S. Cl.
CPC ........ *G11C 11/1653* (2013.01); *G06F 11/1048* (2013.01); *G11C 7/1006* (2013.01); *G11C 11/16* (2013.01); *G11C 11/1673* (2013.01); *G11C 11/1677* (2013.01); *G11C 2029/0411* (2013.01); *G11C 2211/5615* (2013.01)

(58) Field of Classification Search
USPC .................... 365/158, 189.05, 230.06, 230.08
See application file for complete search history.

(56) References Cited

U.S. PATENT DOCUMENTS 6,785,154 B2    8/2004    Sunaga et al.
6,901,025 B2    5/2005    Ooishi
(Continued)

FOREIGN PATENT DOCUMENTS

JP    2004-199777 A    7/2004
JP    2010-009659 A    1/2010

OTHER PUBLICATIONS

U.S. Appl. No. 13/421,505, filed Mar. 15, 2012, Hoya.
(Continued)

*Primary Examiner* — Pho M Luu
(74) *Attorney, Agent, or Firm* — Knobbe Martens Olson & Bear LLP

(57) ABSTRACT

A semiconductor storage device according to the present embodiment includes a plurality of bit lines, a plurality of word lines, and a plurality of memory cells corresponding to intersections between the bit lines and the word lines, respectively, and including magnetic tunnel junction elements capable of storing data. A plurality of sense amplifiers respectively correspond to the bit lines and are configured to detect data stored in the memory cells via a bit line selected from among the corresponding bit lines. A plurality of read latch parts correspond to the sense amplifiers, respectively, and are configured to latch data detected by the corresponding sense amplifiers. A plurality of read global data buses are connected to the read latch parts, respectively, and are configured to consecutively transmit data latched by the read latch parts at a time of a data read operation.

18 Claims, 9 Drawing Sheets

(51) Int. Cl.
*G06F 11/10* (2006.01)
*G11C 7/10* (2006.01)
*G11C 29/04* (2006.01)

(56) References Cited

U.S. PATENT DOCUMENTS

| | | | |
|---|---|---|---|
| 7,263,018 B2 | 8/2007 | Persoon | |
| 7,839,676 B2 | 11/2010 | Kurose | |
| 8,203,888 B2 * | 6/2012 | Fukuda | G11C 11/5642 365/185.01 |
| 8,270,247 B2 * | 9/2012 | Sasaki | G11C 8/08 365/194 |
| 8,472,242 B2 | 6/2013 | Shimomura et al. | |
| 8,482,969 B2 * | 7/2013 | Hoya et al. | 365/158 |
| 8,498,139 B2 * | 7/2013 | Suzuki | G11C 7/062 365/185.21 |
| 8,654,596 B2 * | 2/2014 | Hoya | G11C 7/1006 365/158 |
| 8,804,409 B2 * | 8/2014 | Hoya | G06F 11/1048 365/158 |
| 2009/0323396 A1 | 12/2009 | Inaba | |

OTHER PUBLICATIONS

Notification of Reason for Rejection mailed Jun. 25, 2013 in corresponding Japanese Pat. App. No. 2011-064083 in six (6) pages, In parent.

Notification of Reason for Rejection mailed Sep. 3, 2013 in corresponding Japanese Pat. App. No. 2011-064083 in four (4) pages, In parent.

JEDEC Solid State Technology Association, Low Power Double Data Rate 2 (LPDDR2); Standard No. JESD209-2B, Feb. 2010, pp. 79-94.

* cited by examiner

READ OPERATION

WRITE OPERATION

SEMICONDUCTOR STORAGE DEVICE

CROSS REFERENCE TO RELATED APPLICATIONS

This application is a continuation of U.S. patent application Ser. No. 13/421,505, filed on Mar. 15, 2012, now U.S. Pat. No. 8,804,409, issued Aug. 12, 2014, which is based upon and claims the benefit of priority from the prior Japanese Patent Application No. 2011-64083, filed on Mar. 23, 2011, the entire contents of each of which are incorporated herein by reference.

FIELD

The embodiments of the present invention relate to a semiconductor storage device.

BACKGROUND

A magnetic random access memory (MRAM) is a type of resistance change memories. As techniques for writing data to an MRAM, there have been known magnetic field writing and spin-transfer torque writing. Among these techniques, the spin-transfer torque writing has advantages in higher integration, lower power consumption, and higher performance because of the property of a spin-transfer torque device that a spin injection current is smaller in an amount for magnetization reversal as magnetic bodies become smaller in size. Furthermore, the magnetic field writing disadvantageously and possibly causes occurrence of erroneous writing of data to unselected memory cells as a result of expansion of the magnetic field. The spin-transfer torque writing, by contrast, does not cause occurrence of such erroneous writing of data to unselected memory cells.

However, the read current is minute in the spin-transfer torque device. To quickly sense the difference between such minute currents, it is necessary to increase the size of transistors constituting sense amplifiers (to improve the current driving capability), thereby suppressing the irregularity in the differential amplification performance of the sense amplifiers. As the transistors become larger in size, the size of each sense amplifier itself becomes larger. Therefore, as the MRAM is further downscaled, it becomes more difficult to arrange each of the sense amplifiers to correspond to paired bit lines. Therefore, with the progress in the downscaling of the MRAM, each of the sense amplifiers may be shared among a plurality of paired bit lines. If each sense amplifier is arranged to correspond to a plurality of bit lines, the number of data (a page size) by which data can be written or read by one access decreases. In this way, the conventional spin-transfer torque MRAM has a problem of lower writing and reading speeds than those of a DRAM, for example.

Furthermore, the MRAM has a problem of inversion of data stored in the memory cells during data retention (a retention defect) although the problem occurs at a low probability and incidentally. The MRAM includes ECC (Error Correction Code) circuits to deal with such a retention defect. The MRAM incorporating the ECC temporarily reads data at the time of a data write operation, updates data in a writing target column to write data, and writes data in the memory cells in the other columns after error correction is conducted on the data (using a write mask). Accordingly, the ECC-incorporated MRAM disadvantageously has not only the problem of the reduction in the operating speed because of the small page size but also the problem of the further reduction in the operating speed because of the read operation and error correction operation performed by the ECC.

DETAILED DESCRIPTION

A semiconductor storage device according to the present embodiment comprises a plurality of bit lines, a plurality of word lines, and a plurality of memory cells corresponding to intersections between the bit lines and the word lines, respectively, and including magnetic tunnel junction elements capable of storing data. A plurality of sense amplifiers respectively correspond to the bit lines and are configured to detect data stored in the memory cells via a bit line selected from among the corresponding bit lines. A plurality of read latch parts correspond to the sense amplifiers, respectively, and are configured to latch data detected by the corresponding sense amplifiers. A plurality of read global data buses are connected to the read latch parts, respectively, and are configured to consecutively transmit data latched by the read latch parts at a time of a data read operation.

Embodiments will now be explained with reference to the accompanying drawings. The present invention is not limited to the embodiments.

(First Embodiment)

Figure 1:
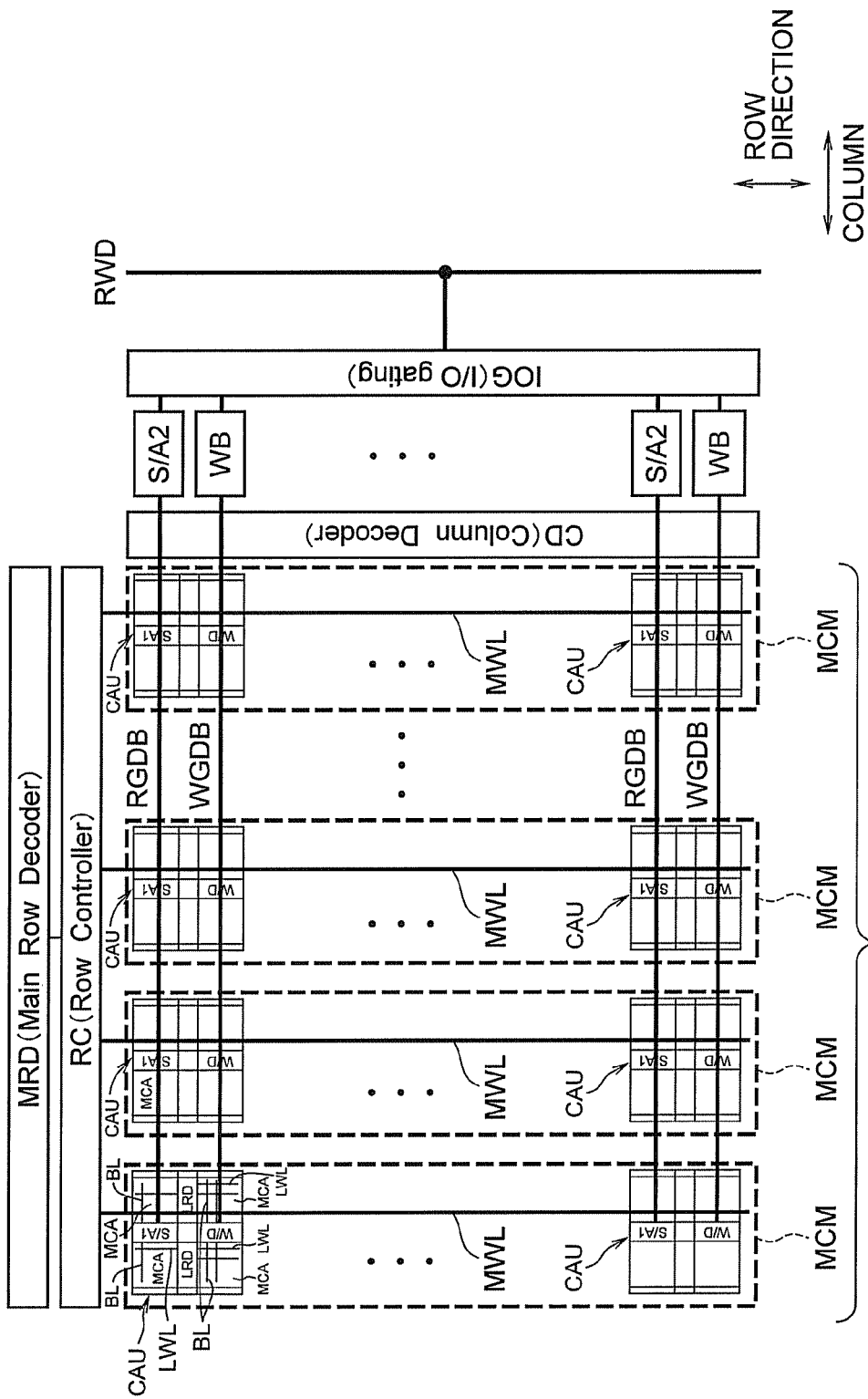
FIG. 1 is a block diagram of memory cell arrays and peripheral circuits of the memory cell arrays in a magnetic random access memory according to a first embodiment.

FIG. 1 is a block diagram of memory cell arrays and peripheral circuits of the memory cell arrays in a magnetic random access memory (hereinafter, "MRAM") according to a first embodiment. The MRAM according to the present embodiment includes a plurality of cell array units CAU each including a plurality of memory cell arrays MCA, a plurality of main word lines MWL, a plurality of local word lines LWL, a plurality of read global data buses RGDB, a plurality of write global data buses WGDB, first sense amplifiers S/A1, second sense amplifiers S/A2, write drivers W/D, write buffers WB, a row controller RC, a main row decoder MRD, a column decoder DC, an input/output gate circuit IOG, and read/write data lines RWD. The number of respective constituent elements shown in FIG. 1 is not limited to any specific one and many arrangements shown in FIG. 1 can be provided in the MRAM. Furthermore, FIG. 1 does not show source lines although the MRAM include the source lines.

Each of the memory cell arrays MCA includes a plurality of memory cells MC arranged two-dimensionally in a matrix.

Figure 3:
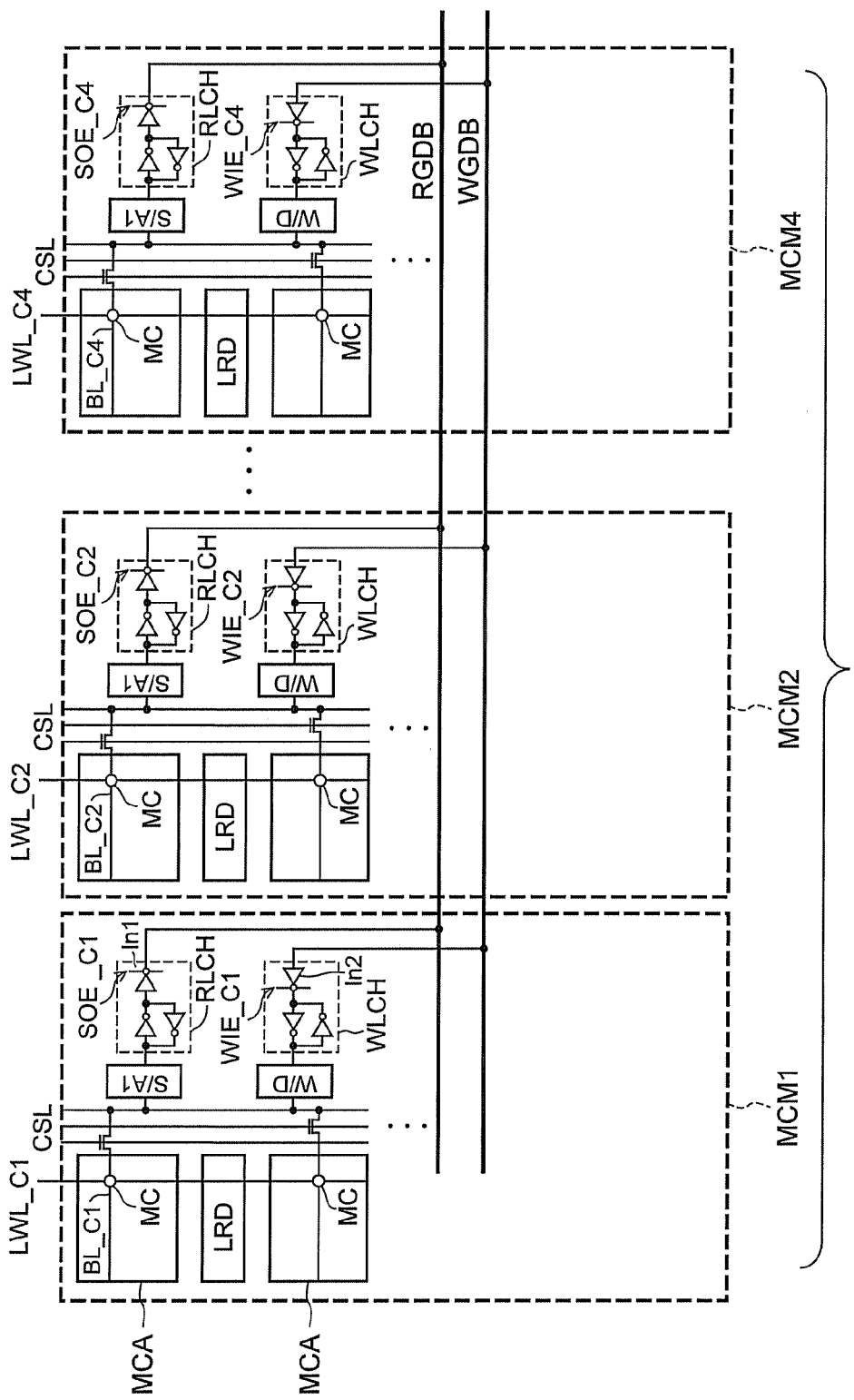
FIG. 3 shows connection relation among the read global data buses RGDB, the write global data buses WGDB, and the memory cell macros MCM.

As shown in FIG. 3, the memory cells MC are arranged to correspond to intersections between bit lines (or bit line pairs) BL and the local word lines LWL, respectively. The bit lines BL extend in a column direction and the local word lines LWL extend in a row direction orthogonal to the column direction.

The main word lines MWL are connected to local row decoders LRD, and each of the local row decoders LRD is connected to the memory cells MC via the local word lines LWL. In each of the cell array units CAU belonging to each memory cell macro MCM, the main word lines MWL correspond to the local word lines LWL by one-to-one correspondence. Therefore, in the present embodiment, there is no need to distinguish the main word lines MWL from the local word lines LWL, and "word lines" in the claims can be interpreted as either the main word line MWL or the local word lines LWL.

A plurality of memory cell arrays MCA constitute one cell array unit CAU. In FIG. 1, the four memory cell arrays MCA constitute one cell array unit CAU. However, the number of memory cell arrays MCA included in each cell array unit CAU is not limited to any specific one.

A plurality of cell array units CAU sharing the main word lines MWL constitute one memory cell macro MCM. The memory cell macro MCM is an activation unit per which data is simultaneously read in response to one read command or data is simultaneously written in response to one write command.

A plurality of memory cell macros MCA sharing the read global data buses RGDB and the write global data buses WGDB constitute one macro block MB. Like the memory cell arrays MCA, the number of cell array units CAU included in each memory cell macro MCM is not limited to any specific one.

Each of the first sense amplifiers S/A1 is provided to correspond to a plurality of bit lines BL, and detects data transmitted via one of the bit lines BL. Each of the write drivers W/D is provided to correspond to a plurality of bit lines BL, and writes data to the memory cells MC via one of the bit lines BL.

Each of the cell array units CAU includes one or a plurality of first sense amplifiers S/A1 and one or a plurality of write drivers W/D. A plurality of first sense amplifiers S/A1 in one memory cell macro MCM are connected to the different read global data buses RGDB, respectively. A plurality of write drivers W/D in one memory cell macro MCM are connected to the different write global data buses WGDB, respectively. That is, each read global data bus RGDB and each write global data bus WGDB are provided to correspond to one first sense amplifier S/A1 and one write driver W/D, respectively by one-to-one correspondence. Therefore, one read global data bus RGDB and one write global data buses WGDB are provided to correspond to a plurality of bit lines BL corresponding to the first sense amplifier S/A1 and those corresponding to the write driver W/D, respectively.

The read global data buses RGDB and the write global data buses WGDB extend in the column direction. The main word lines MWL extend in the row direction orthogonal to the column direction.

Each of the read global data buses RGDB is connected to one second sense amplifier S/A2 via the column decoder CD. Each of the write global data buses WGDB is connected to one word buffer WB via the column decoder CD. The column decoder CD is configured to select bit lines BL in response to column addresses. At this time, the column decoder CD selects and drives one bit line BL for one first sense amplifier S/A1.

The second sense amplifiers S/A2 and the write buffers WB are connected to the read/write data lines RWD via the input/output gate circuit IOG. Each of the second sense amplifiers S/A2 amplifies read data obtained from the corresponding read global data bus RGDB and transmits the amplified read data to outside of a memory chip via the read/write data line RWD. Each of the write buffers WB amplifies write data obtained from the read/write data line RWD and transmits the amplified write data to the write driver W/D via the write global data bus RGDB.

The read/write data lines RWD are as many as pairs of second sense amplifiers S/A2 and write buffers WB. The read/write data lines RWD can output data, which is simultaneously read out from one memory cell macro MCM to the second sense amplifiers S/A2, to the outside of the memory chip in parallel. Furthermore, the read/write data lines RWD can capture data, which is simultaneously written to one memory cell macro MCM to the write buffers WB, from the outside of the memory chip in parallel. For example, when the number of pairs of second sense amplifiers S/A2 and write buffers WB in one macro block MB is 64, 64 read/write data lines RWD are provided to correspond to the pairs, respectively. The MRAM can thereby simultaneously read or write 64-bit data.

The main word lines MWL are connected to the row controller RC and the row controller RC is connected to the main row decoder MRD. The main row decoder MRD decodes row addresses. The row controller RC selects one main word line MWL in each of the memory cell macros MCM within the macro block MB in response to a row address. When the row controller RC selects one main word line MWL, the local word line LWL corresponding to the main word line MWL is selected in each of the cell array units CAU. In the memory cell macros MCM, each of the first sense amplifiers S/A1 can thereby detect data stored in the memory cell MC (hereinafter, "selected memory cell MC") corresponding to the intersection between the bit line (or bit line pair) BL selected in response to a column address and the main word line MWL (or the local word line LWL) selected in response to the row address. Furthermore, in the memory cell macros MCM, each of the write drivers W/D can writes data to the selected memory cell MC.

In the present embodiment, at the time of a data read operation or a data write operation, the main word lines MWL corresponding to the respective memory cell macros MCM are driven consecutively in the macro block MB. At the time of the data read operation, a plurality of memory cell macros MCM in the macro block MB thereby consecutively transmit data to the read global data buses RGDB. Alternatively, at the time of the data write operation, the memory cell macros MC in the macro block MB thereby consecutively capture data from the write global data buses WGDB. In other words, the memory cell macros MRM according to the present embodiment can realize a burst read operation and a burst write operation by performing an interleaved operation between the memory cell macros MCM in the macro block MB.

Figure 2:
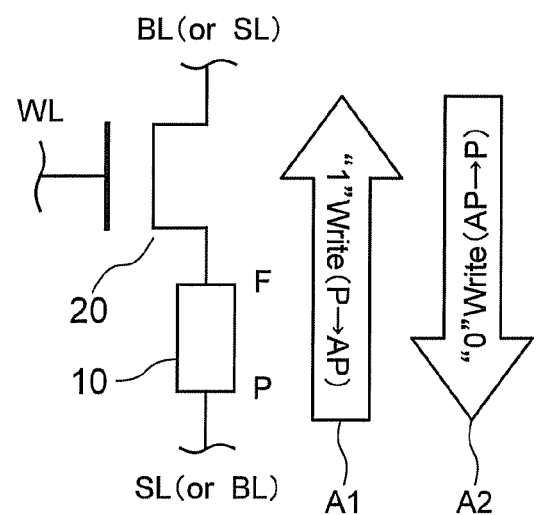
FIG. 2 is an explanatory diagram showing a configuration and an operation of a single memory cell MC.

FIG. 2 is an explanatory diagram showing a configuration and an operation of a single memory cell MC. Each memory cell MC includes a magnetic tunnel junction (MTJ) element 10 and a cell transistor 20. The MTJ element 10 and the cell transistor 20 are connected in series between one bit line BL and one source line SL (or another bit line BL). In the memory cell MC, the cell transistor 20 is arranged near the bit line BL and the MTJ element 10 is arranged near the source line SL. A gate of the cell transistor 20 is connected to one word line WL (the main word line MWL or the local word line LWL).

The STT (Spin Transfer Torque)-MTJ element 10 that uses the TMR (tunneling magnetoresistive) effect has a stacked structure in which a nonmagnetic layer (tunnel dielectric film) is sandwiched between two ferromagnetic layers. The MTJ element 10 stores therein digital data by a change in a magnetic resistance due to the spin-polarized tunneling. The MTJ element 10 can be set in a low resistance state or a high resistance state depending on magnetization orientations of the two ferromagnetic layers. For example, when it is defined that the low resistance state indicates data "0" and that the high resistance state indicates data "1", one-bit data can be recorded in the MTJ element 10. Needless to say, it can be defined that the low resistance state indicates data "1" and that the high resistance state indicates data "0". For example, the MTJ element 10 is configured to sequentially stack a pinned layer P, a tunnel barrier layer, and a recording layer F. The pinned layer P and the recording layer F are made of a ferromagnetic body and the tunnel barrier layer is an insulating film. The pinned layer P has a fixed magnetization orientation, and the recording layer F has a variable magnetization orientation. The MTJ element 10 stores therein data depending on the magnetization orientation of the recording layer F.

When electric current flows in an arrow A1 direction at the time of the data write operation, the magnetization orientation of the recording layer F is anti-parallel to that of the pinned layer P, whereby the MTJ element 10 is in the high resistance state (data "1"). When the electric current flows in an arrow A2 direction during the data write operation, the magnetization orientation of the recording layer F is parallel to that of the pinned layer P, whereby the MTJ element 10 is in the low resistance state (data "0"). In this way, different data can be written to the MTJ element 10 depending on the direction of the electric current.

FIG. 3 shows connection relation among the read global data buses RGDB, the write global data buses WGDB, and the memory cell macros MCM. FIG. 3 shows two memory cell arrays MCA in each memory cell macro MCM by way of example. In FIG. 3, a pair of the first sense amplifier S/A1 and the write driver W/D and a pair of the read global data bus RGDB and the write global data bus WGDB are shown in each memory cell macro MCM. However, in practice, a plurality of pairs of the first sense amplifiers S/A1 and the write drivers W/D and a plurality of pairs of the read global data buses RGDB and the write global data buses WGDB are provided in each memory cell macro MCM.

In each memory cell macro MCM, the local row decoder LRD is provided between the two memory cell arrays MCA. The local row decoder LRD functions as a buffer for driving one local word line LWL. Therefore, in practice, the row controller RC drives one local word line WL via the main word line MWL and the local row decoder RD in each memory cell macro MCM. FIG. 3 does not show the main word lines MWL.

The memory cell macros MCM within the same macro block MB share the read global data buses RGDB and the write global data buses WGDB.

On the other hand, the first sense amplifiers S/A1 in each memory cell macro MCM are connected to the different read global data buses RGDB via a plurality of read latch parts RLCH, respectively. Each of the read latch parts RLCH is provided to correspond to one first sense amplifier S/A1 and connected between one first sense amplifier S/A1 and one read global data bus RGDB. The read latch part RLCH is configured to latch the data detected by the corresponding first sense amplifier S/A1. The read latch part RLCH includes a gated inverter Int that outputs the latched data at a time determined by an output enable signal SOE_Ci (i is an integer).

The write drivers W/D in each memory cell macro MCM are connected to the different write global data buses WGDB via a plurality of write latch parts WLCH, respectively.

Each of the write latch parts WLCH is provided to correspond to one write driver W/D and connected between one write driver W/D and one write global data bus WGDB. The write latch part WLCH includes a gated inverter Int that receives write data from the write global data bus WGDB at a time determined by an input enable signal WIE_Ci. The write latch part WLCH is thereby configured to latch data to be sent to the corresponding write driver W/D.

One first sense amplifier S/A1 and one write driver W/D are connected to the bit line BL selected by a column select line CSL. In FIG. 3, it appears that one of the memory cell arrays MCA is connected to the first sense amplifier S/A1 and that the other memory cell array MCA is connected to the write driver W/D in each memory cell macro MCM. However, each memory cell array MCA can be connected to both the first sense amplifier S/A1 and the write driver W/D via the column select line CSL. The column decoder CD controls the voltage of the column select line CSL.

In the present embodiment, output enable signals SOE_C1 to SOE_C4 are consecutively activated in order at different times at the time of the data read operation, and the read latch parts RLCH in each memory cell macro MCM consecutively output the read data to the respective read global data buses RGDB. At this time, the read latch parts RLCH in one memory cell macro MCM can simultaneously transmit the data to the read global data buses RGDB connected to the read latch parts RLCH, respectively. That is, one main word line MWL is selected in one memory cell macro MCM, and the first sense amplifiers S/A1 simultaneously read data stored in the memory cells MC connected to the selected main word line MWL. The data can be thereby transmitted to the read global data buses RGDB while making full use of all the read global data buses RGDB within the macro block MB. Furthermore, the read latch parts RLCH in the different memory cell macros MCM within one macro block MB transmit data to the respective read global data buses RGDB at different times. A plurality of pieces of data can be thereby consecutively transmitted to the corresponding read global data buses RGDB without collision.

Further, input enable signals WIE_C1 to WIE_C4 are consecutively activated in order at different times at the time of the data write operation, and the write latch parts WLCH in each memory cell macro MCM consecutively capture data from the respective write global data buses WGDB. At this time, the write latch parts WLCH in one memory cell macro MCM can simultaneously capture the data from the write global data buses WGDB connected to the write latch parts WLCH, respectively. The data can be thereby transmitted from the write global data buses WGDB while making full use of all the write global data buses WGDB within the macro block MB. Furthermore, the write latch parts WLCH in the different memory cell macros MCM within one macro block MB receive data from the respective write global data buses WGDB at different times. A plurality of pieces of data can be thereby consecutively transmitted to the corresponding write latch parts WLCH without collision.

Figure 4:
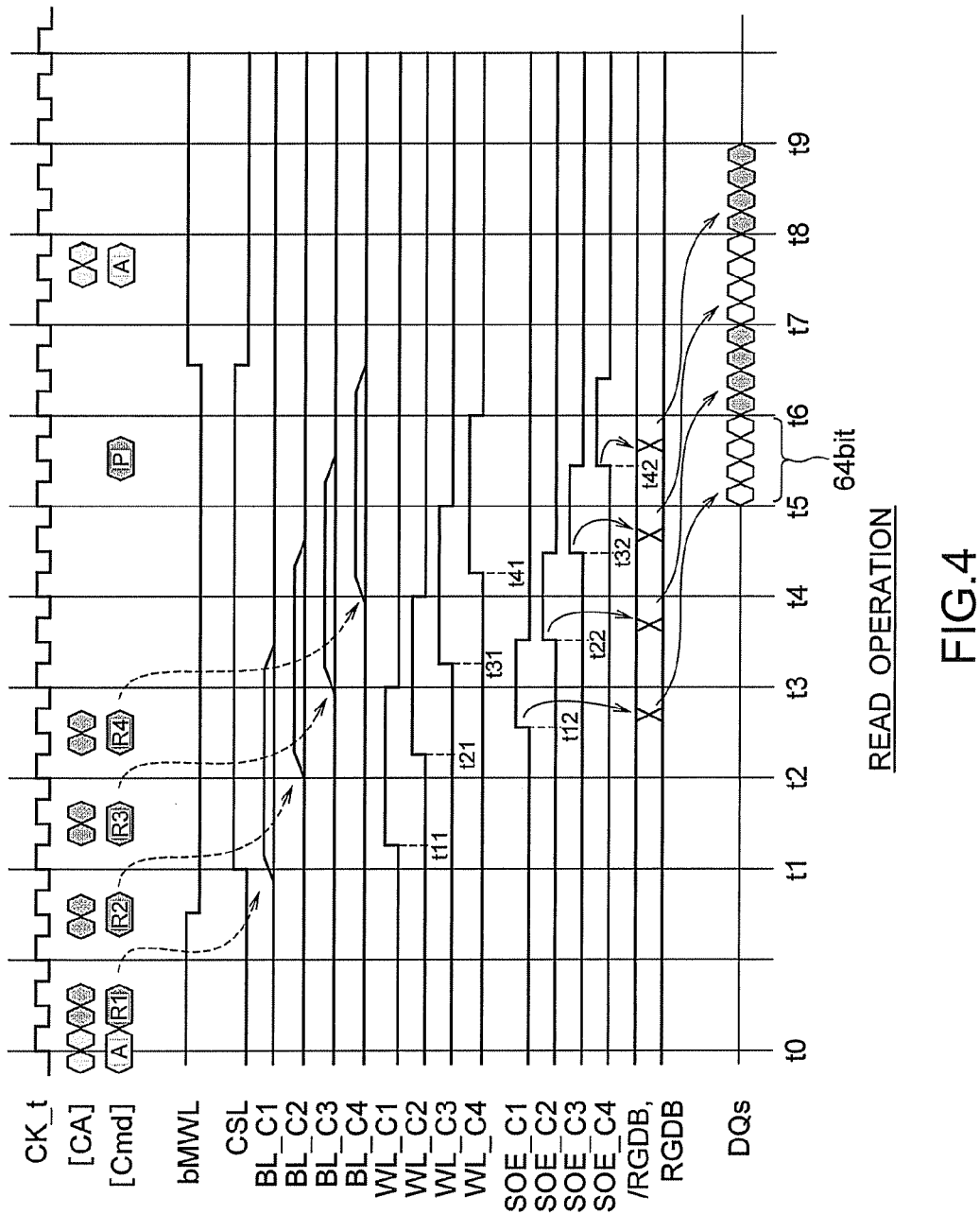
FIG. 4 is a timing diagram showing the data read operation performed by the MRAM according to the first embodiment.

FIG. 4 is a timing diagram showing the data read operation performed by the MRAM according to the present embodiment. For example, it is assumed that each macro block MB includes four memory cell macros MCM.

It is also assumed that each memory cell macro MCM includes eight cell array units CAU, and that each cell array unit CAU includes eight first sense amplifiers S/A1 and eight write drivers W/D.

Therefore, the memory cell macros MCM are consecutively activated at different times in response to four read commands R, respectively. Each of the memory cell macros MCM activated in response to one read command R outputs 64-bit data (eight CAU×eight S/A1) to the read/write data lines RWD.

The read operation is explained in more detail below.

Addresses (column addresses CA, row addresses, and the like) and various commands Cmd (an active command A, read commands Ri, and the like) are transmitted to the MRAM in response to a clock CK_t. In response to one of the row addresses, one main word line MWL is selected in one memory cell macro MCM and one local word line LWL is also selected in each of the cell array units CAU connected to the selected main word line MWL. In response to the column addresses, the bit lines BL connected to the respective first sense amplifiers S/A1 are selected in the memory cell macros MCM. The first sense amplifiers S/A1 in the memory cell macros MCM simultaneously read data from selected memory cells MC connected to the selected bit lines BL and the selected local word line LWL.

At t0, when the memory receives the active command A, the row addresses are selected. Thereafter, when the memory receives the read commands R1 to R4, the column addresses are selected.

When a word enable signal bMWL is activated to a low level, word lines WL_C1 to WL_C4 can be driven in response to the row addresses, respectively. When the column select line CSL is activated to a high level, the bit lines BL selected in response to the column addresses are connected to the first sense amplifiers S/A1, respectively.

For example, after receiving the active command A, the memory consecutively receives the read commands R1 to R4 at different times. After the activation of the column select line CSL, the column decoder CD selectively activates a bit line BL_C1 in response to the column address indicated by the read command R1 (t1). The column decoder CD selectively activates a bit line BL_C2 in response to the column address indicated by the read command R2 (t2). The column decoder CD selectively activates a bit line BL_C3 in response to the column address indicated by the read command R3 (t3). The column decoder CD selectively activates a bit line BL_C4 in response to the column address indicated by the read command R4 (t4).

After the activation of the word enable signal bMWL, the row controller RC and the row decoders RD activate local word lines LWL_C1 to LWL_C4 at different times in response to the row addresses, respectively. For example, after the activation of the bit line BL_C1, the local word line LWL_C1 is activated (t11), whereby the first sense amplifier S/A1 connected to the local word line LWL_C1 detects data stored in the selected memory cell MC connected to the bit line BL_C1 and the local word line LWL_C1. Similarly, after the activation of the bit line BL_C2, the local word line LWL_C2 is activated (t21), whereby the first sense amplifier S/A1 connected to the local word line LWL_C2 detects data stored in the selected memory cell MC connected to the bit line BL_C2 and the local word line LWL_C2. After the activation of the bit line BL_C3, the local word line LWL_C3 is activated (t31), whereby the first sense amplifier S/A1 connected to the local word line LWL_C3 detects data stored in the selected memory cell MC connected to the bit line BL_C3 and the local word line LWL_C3. After the activation of the bit line BL_C4, the local word line LWL_C4 is activated (t41), whereby the first sense amplifier S/A1 connected to the local word line LWL_C4 detects data stored in the selected memory cell MC connected to the bit line BL_C4 and the local word line LWL_C4.

The read latch parts RLCH corresponding to the respective first sense amplifiers S/A1 latch (prefetch) the data detected by the first sense amplifiers S/A1.

At a time t12, the output enable signal SOE_C1 is activated. The read latch part RLCH in a memory cell macro MCM1 shown in FIG. 3 thereby transmits the data to the read global data bus RGDB. Similarly, at a time t22, the output enable signal SOE_C2 is activated. The read latch part RLCH in a memory cell macro MCM2 thereby transmits the data to the read global data bus RGDB. At a time t32, the output enable signal SOE_C3 is activated. The read latch part RLCH in a memory cell macro MCM3 thereby transmits the data to the read global data bus RGDB. At a time t42, the output enable signal SOE_C4 is activated. The read latch part RLCH in a memory cell macro MCM4 thereby transmits the data to the read global data bus RGDB.

These read data are amplified by the sense amplifiers S/A2 and transmitted to the read/write data lines RWD, respectively via the input/output gate circuit IOG. The read/write data lines RWD output the data to the outside of the memory chip via a DQ buffer (not shown).

At t5 and t6, the 64-bit data read from the memory cell macro MCM1 is output to the outside of the memory chip. Subsequently, at t6 and t7, the 64-bit data read from the memory cell macro MCM2 is output to outside. Subsequently, at t7 and t8, the 64-bit data read from the memory cell macro MCM3 is output to outside. Subsequently, at t8 and t9, the 64-bit data read from the memory cell macro MCM4 is output to outside. In this way, the data can be consecutively read from the memory cell macros MCM within the macro block MB.

The times t12, t22, t32, and t42, when the output enable signals SOE_C1 to SOE_C4 are activated, respectively are set such that the data read from the memory cell macros MCM can be consecutively output.

Thereafter, the voltage of the bit lines BL is reset in response to a precharge command P.

As described above, according to the present embodiment, at the time of the data read operation, the memory cell macros MCM1 to MCM4 within the macro block MB consecutively transmit the data prefetched by the read latch parts RLCH to the read global data buses RGDB at the different times, respectively. As a result, the MRAM according to the present embodiment like the DRAM can perform the burst read operation although each first sense amplifier S/A1 and each second sense amplifier S/A2 are provided to correspond to a plurality of bit lines BL.

Figure 5:
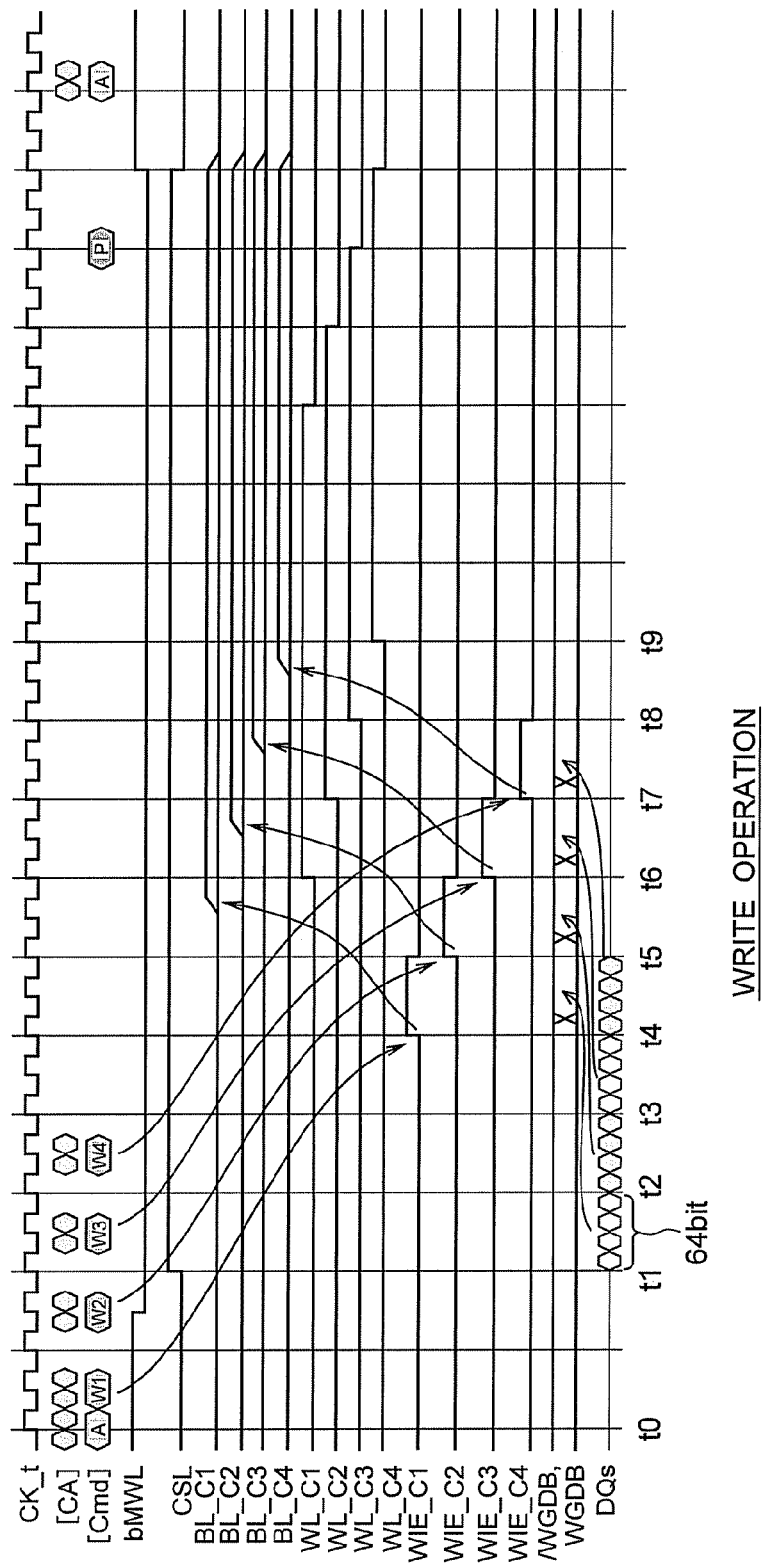
FIG. 5 is a timing diagram showing the data write operation performed by the MRAM according to the first embodiment.

FIG. 5 is a timing diagram showing the data write operation performed by the MRAM according to the present embodiment.

At t0, when the memory receives the active command A, the row addresses are selected. Thereafter, when the memory receives write commands W1 to W4, the column addresses are selected. In response to one of the row addresses, one main word line MWL is selected in one memory cell macro MCM and one local word line LWL is also selected in each cell array unit CAU connected to the selected main word line MWL. In response to the column addresses, the bit lines BL connected to the respective first sense amplifiers S/A1 are selected in the memory cell macros MCM. The first sense amplifiers S/A1 in the memory cell macros MCM simultaneously write data to selected memory cells MC connected to the selected bit lines BL and the selected local word line LWL.

When the word enable signal bMWL is activated to a low level, the local word lines LWL_C1 to LWL_C4 can be driven in response to the row addresses, respectively. When the column select line CSL is activated to a high level, the bit lines BL selected in response to the column addresses are connected to the first sense amplifiers S/A1, respectively as described above with reference to FIG. 3.

For example, after receiving the active command A, the memory consecutively receives the write commands W1 to W4 at different times. Upon reception of the write command W1, the memory receives write data from the DQ buffer via the read/write line RWD (t1 to t2). The write data is transmitted to the write buffer WB via the input/output gate circuit IOG and amplified by the write buffer WB. After the amplification, the write data is transmitted to the write global data bus WGDB.

After receiving the write command W1, at the time t4, the input enable signal WIE_C1 is activated and the write latch part WLCH in the memory cell macro MCM1 shown in FIG. 3 latches (prefetches) the data transmitted from the write global data bus WGDB.

Similarly, upon reception of the write command W2, the memory receives write data from the DQ buffer via the read/write line RWD (t2 to t3). The write data is transmitted to the write global data bus WGDB.

After receiving the write command W2, at the time t5, the input enable signal WIE_C2 is activated and the write latch part WLCH in the memory cell macro MCM2 latches the data transmitted from the write global data bus WGDB.

Upon reception of the write command W3, the memory receives write data from the DQ buffer via the read/write line RWD (t3 to t4). The write data is transmitted to the write buffer WB.

After receiving the write command W3, at the time t6, the input enable signal WIE_C3 is activated and the write latch part WLCH in the memory cell macro MCM3 latches the data transmitted from the write global data bus WGDB.

Upon reception of the write command W4, the memory receives write data from the DQ buffer via the read/write line RWD (t4 to t5). The write data is transmitted to the write global data bus WGDB.

After receiving the write command W4, at the time t7, the input enable signal WIE_C4 is activated and the write latch part WLCH in the memory cell macro MCM4 latches the data transmitted from the write global data bus WGDB.

Next, the row controller RC and the row decoders RD activate the local word lines LWL_C1 to LWL_C4 at different times in response to the row addresses. At this time, the first sense amplifier S/A1 corresponding to each write latch part WLCH writes data to the selected memory cell MC via the bit line BL_Ci selected in response to each column address.

For example, at t6, when the local word line LWL_C1 is activated, the first sense amplifier S/A1 in the memory cell macro MCM1 writes the data latched by the corresponding write latch part WLCH to the selected memory cell MC via the bit line BL_C1. At this time, all the first sense amplifiers S/A1 in the memory cell macro MCM1 simultaneously write the data latched by the corresponding write latch parts WLCH to the selected memory cells MC.

Similarly, at t7, when the local word line LWL_C2 is activated, the first sense amplifier S/A1 in the memory cell macro MCM2 writes the data latched by the corresponding write latch part WLCH to the selected memory cell MC via the bit line BL_C2. At this time, all the first sense amplifiers S/A1 in the memory cell macro MCM2 simultaneously write the data latched by the corresponding write latch parts WLCH to the selected memory cells MC.

At t8, when the local word line LWL_C3 is activated, the first sense amplifier S/A1 in the memory cell macro MCM3 writes the data latched by the corresponding write latch part WLCH to the selected memory cell MC via the bit line BL_C3. At this time, all the first sense amplifiers S/A1 in the memory cell macro MCM3 simultaneously write the data latched by the corresponding write latch parts WLCH to the selected memory cells MC.

At t9, when the local word line LWL_C4 is activated, the first sense amplifier S/A1 in the memory cell macro MCM4 writes the data latched by the corresponding write latch part WLCH to the selected memory cell MC via the bit line BL_C4. At this time, all the first sense amplifiers S/A1 in the memory cell macro MCM4 simultaneously write the data latched by the corresponding write latch parts WLCH to the selected memory cells MC.

At t1 and t2, the 64-bit data to be written to the memory cell macro MCM1 is input thereto. Subsequently, at t2 and t3, the 64-bit data to be written to the memory cell macro MCM2 is input thereto. Subsequently, at t3 and t4, the 64-bit data to be written to the memory cell macro MCM3 is input thereto. Subsequently, at t4 and t5, the 64-bit data to be written to the memory cell macro MCM4 is input thereto. In this way, the data can be consecutively input to the memory cell macros MCM within the macro block MB.

The times t4 to t7, when the input enable signals WIE_C1 to WIE_C4 are activated, respectively are set such that the data write to the memory cell macros MCM can be consecutively captured.

As described above, according to the present embodiment, at the time of the data write operation, the memory cell macros MCM1 to MCM4 within the macro block MB can consecutively capture the write data from the write global data buses WGDB at the different times, respectively, and the write latch parts WLCH can prefetch the data. As a result, the MRAM according to the present embodiment like the DRAM can perform the burst write operation although each first sense amplifier S/A1 and each second sense amplifier S/A2 are provided to correspond to a plurality of bit lines BL.

As described above, the MRAM can perform the burst read operation and the burst write operation over a plurality of memory cell macros MCMi. The present embodiment can, therefore, substantially increase the page size per which data can be written or read in response to one write or read command. This configuration can accelerate the operating speed.

Generally, the DRAM is a volatile memory, and bit lines correspond to sense amplifiers by one-to-one correspondence. Accordingly, in the DRAM, data in all columns is read by one read operation. Thereafter, it is necessary to write back the data to the memory cells.

The MRAM according to the present embodiment, by contrast, is a nonvolatile memory, and each of the first sense amplifiers S/A1 is provided to correspond to a plurality of bit lines BL via the column select line CSL. In the MRAM according to the present embodiment, therefore, only the data requested to access can be read and it is unnecessary to write back the data to the memory cells MC. As a result, it is possible to prevent data from being read unnecessarily.

Furthermore, according to the present embodiment, the read global data buses RGDB and the write global data buses WGDB are separately provided for the data read operation and the data write operation, respectively. In the present embodiment, therefore, the operation for reading data from the read latch parts RLCH and that for transmitting data to the write latch parts WLCH can be performed simultaneously in parallel. This configuration can accelerate the operation speed when the data read operation and the data write operation are performed consecutively.

(First Modification of First Embodiment)

Figure 6:
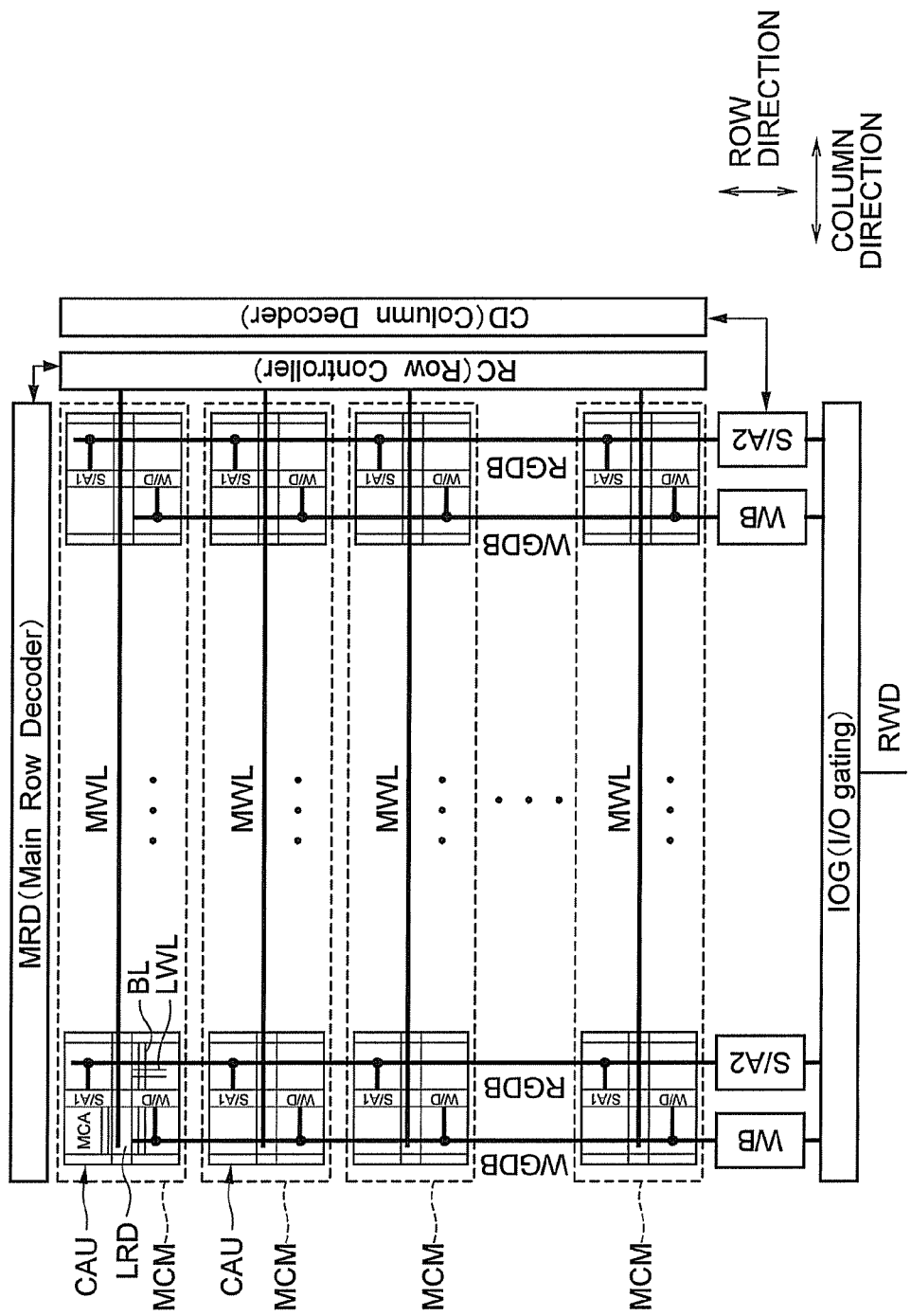
FIG. 6 is a block diagram of a semiconductor storage device according to a first modification of the first embodiment.

FIG. 6 is a block diagram of a semiconductor storage device according to a first modification of the first embodiment. The present modification differs from the first embodiment in that the relation between the extending direction of the read global data buses RGDB and the write global data buses WGDB and that of the main word lines MWL is opposite to that in the first embodiment. For the sake of convenience, the row direction and the column direction shown in FIG. 1 are applied in the present modification. In this case, in the present modification, the read global data buses RGDB and the write global data buses WGDB extend in the row direction and the main word lines MWL extend in the column direction.

Following this difference, the row controller RC, the input/output gate circuit IOG, the second sense amplifiers S/A2, and the write buffers WB are arranged differently from those shown in FIG. 1.

The cell array units CAU according to this modification are arranged similarly to those according to the first embodiment.

In the present modification, a plurality of cell array units CAU arranged in the column direction constitute one memory cell macro MCM because the main word lines MWL extend in the column direction. That is, the cell array units CAU sharing the main word lines MWL and constituting one memory cell macro MCM are arranged in the column direction.

The data read operation and data write operation according to the present modification are the same as those according to the first embodiment. Therefore, in the present modification like the first embodiment, the main word lines MWL corresponding to the respective memory cell macros MCM are driven consecutively in the macro block MB. With this configuration, at the time of the data read operation, the memory cell macros MCM in the macro block MB thereby consecutively transmit data to the read global data buses RGDB. Alternatively, at the time of the data write operation, the memory cell macros MCM in the macro block MB thereby consecutively capture data from the write global data buses WGDB. It is thereby possible to realize the burst read operation and the burst write operation.

In this way, the present modification can achieve effects identical to those of the first embodiment despite the difference from the first embodiment in the setting of the memory cell macros MCM serving as the unit per which data is simultaneously read or written.

(Second Embodiment)

Figure 7:
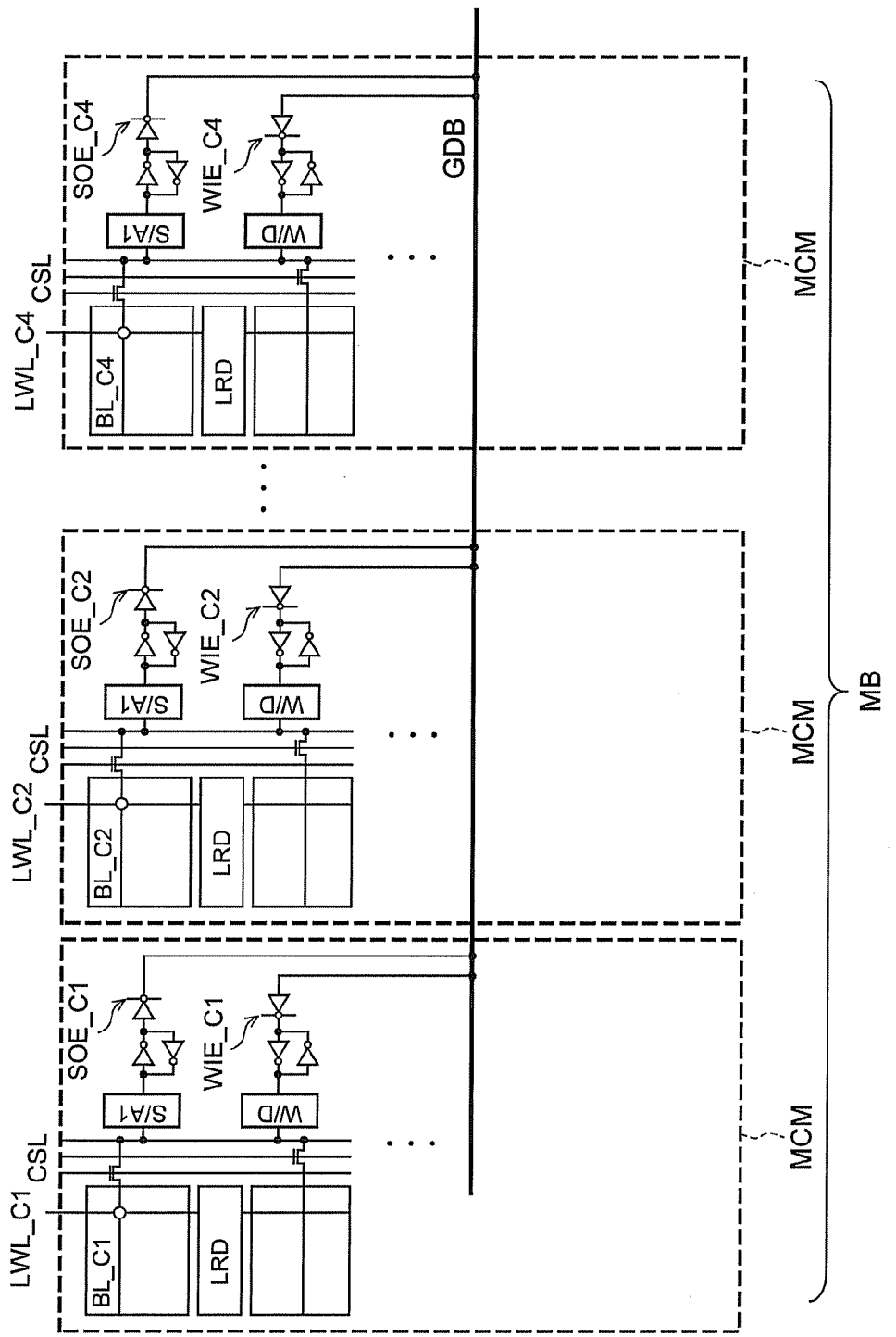
FIG. 7 is a schematic diagram showing a configuration of an MRAM according to a second embodiment.

FIG. 7 is a schematic diagram showing a configuration of an MRAM according to a second embodiment. In the second embodiment, one read global data bus RGDB and one write global data bus WGDB are combined into a single wiring (global data bus GDB). Each pair of the second sense amplifier S/A2 and the write buffer WB share one global data bus GDB.

In this case, the memory cannot simultaneously perform the data read operation and the data write operation. However, when the memory performs the data read operation and the data write operation at different times, the global data buses GDB each serving as read and write global data buses RGDB and WGDB can be used as described in the second embodiment.

For example, because each read latch part RLCH includes the gated inverter In1 and each write latch part WLCH includes the gated inverter In2, data can be transmitted to or captured from each of the global data buses GDB at a desired time. This enables the read data and write data to be transmitted without overlapping on the global data buses GDB. That is why the global data buses GDB each serving as read and write global data buses RGDB and WGDB can be used.

In the second embodiment, the memory performs the data read operation and the data write operation using the common global data buses GDB, which can facilitate the layout of wirings in designing the MRAM.

(Third Embodiment)

Figure 8:
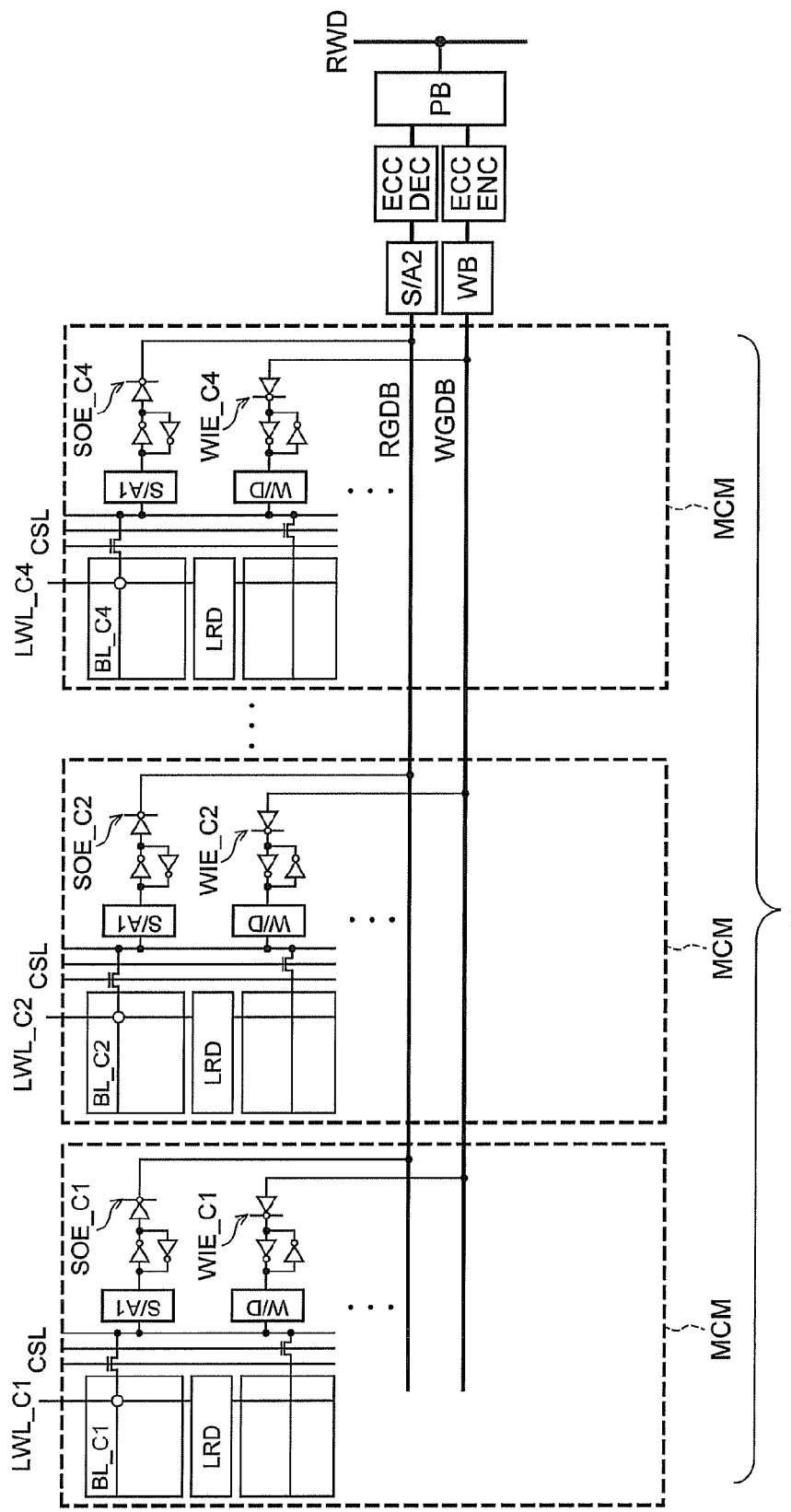
FIG. 8 is a schematic diagram showing a configuration of an MRAM according to a third embodiment.

FIG. 8 is a schematic diagram showing a configuration of an MRAM according to a third embodiment. ECC circuits are incorporated in the MRAM according to the third embodiment. Therefore, the MRAM according to the third embodiment is configured to correct errors at the time of a data read operation.

More specifically, in the third embodiment, an ECC decoder ECCDEC and a page buffer PB are connected between one second sense amplifier S/A2 and one read/write data line RWD. An ECC encoder ECCENC and the page buffer PB are connected between one second write buffer WB and one read/write data line RWD. The page buffer PB is shared between the ECC decoder ECCDEC and the ECC encoder ECCENC. The internal configuration of the macro block MB according to the third embodiment can be identical to that of the macro block MB according to the first embodiment.

If the ECC decoders ECCDEC and the ECC encoders ECCENC are to be incorporated in the MRAM, a data read operation is necessary to perform at the time of the data write operation so as to correspond to a write mask.

Figure 9:
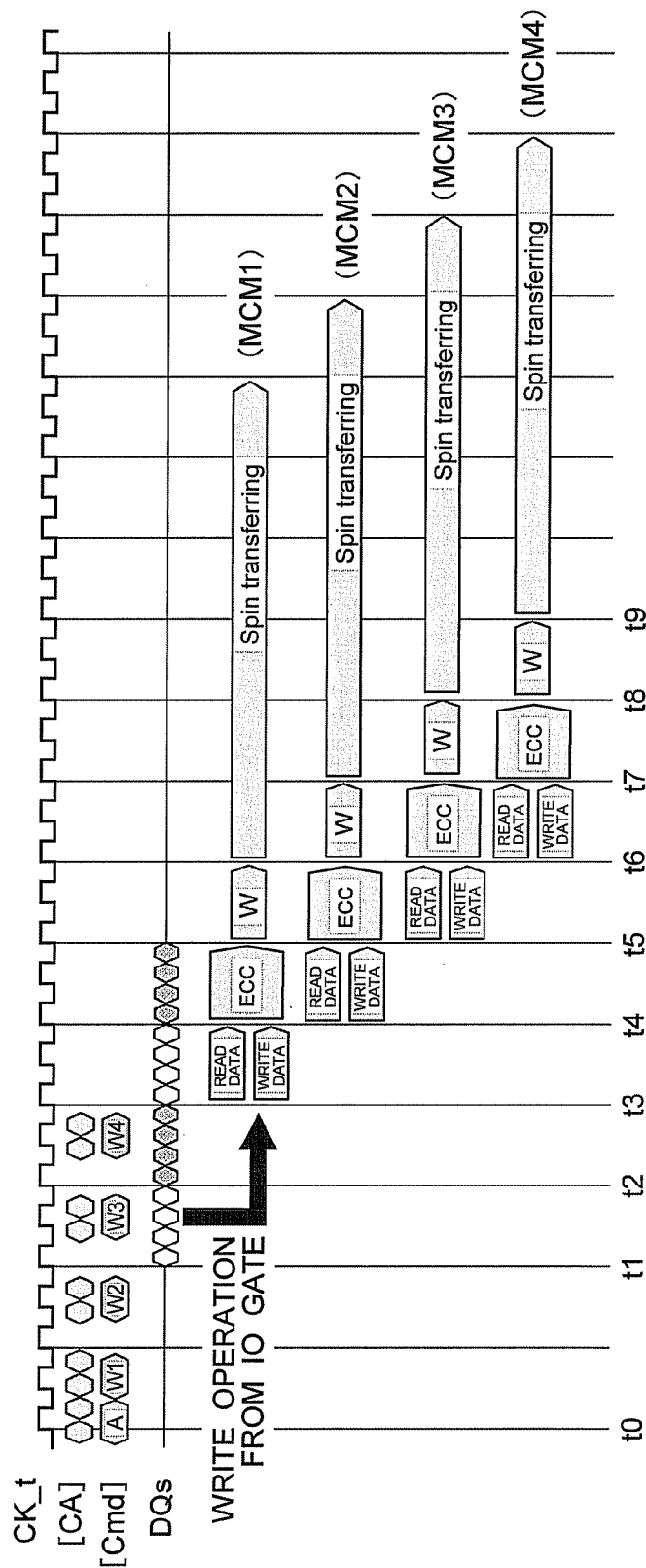
FIG. 9 is a timing chart showing the data write operation performed by the MRAM according to the third embodiment.

FIG. 9 is a timing chart showing the data write operation performed by the MRAM according to the third embodiment. At t0, when the memory receives the active command A, row addresses are selected. Thereafter, when the memory receives the write commands W1 to W4, column addresses are selected. The write data is input to the memory via the read/write data lines RWD. The times at which the memory receives these commands from outside and the write data is input to the memory are the same as those for the data write operation according to the first embodiment (see FIG. 5).

In the third embodiment, when the row addresses and the column addresses are selected, the first sense amplifiers S/A1 temporarily read data from the memory cells MC in all the columns connected to the writing target main word lines MWL in the respective memory cell macros MCM1 to MCM4. The ECC decoder ECCDEC corrects errors in the data read from the memory cell macro MCM1. The error-corrected data is temporarily stored in the corresponding page buffer PB (t3 to t4).

On the other hand, the page buffer PB receives write data from the read/write data line RWD (t3 to t4). The write data is not always the data corresponding to all the columns but is sometimes the data corresponding to a part of the columns.

In the page buffer PB, at least a part of the read data is overwritten by the write data. At this time, the page buffer PB overwrites the write data only on the data in the columns corresponding to the write data and does not change the data in the other columns. The ECC encoder ECCENC calculates the parity of the overwritten data (t4 to t5), and the data in the page buffer PB is transmitted to the memory cell macro MCM1 via the write global data bus WGDB (t5 to t6). The write driver WD writes the data to the memory cells MC in all the columns connected to the writing target main word line MWL (after t6).

The memory performs the data read operation and the data overwrite operation on each of the memory cell macros MCM1 to MCM4. Right after the write data is overwritten on the data read from the memory cell macro MCM1, data is read from the memory cell macro MCM2. Similarly, right after the write data is overwritten on the data read from the memory cell macro MCM2, data is read from the memory cell macro MCM3. Right after the write data is overwritten on the data read from the memory cell macro MCM3, data is read from the memory cell macro MCM4. With this process, the data stored in the memory cell macros MCM1 to MCM4 is consecutively read and stored in the page buffers PB. Furthermore, the data stored in the memory cell macros MCM1 to MCM4 is consecutively updated to the corresponding write data and consecutively written back.

There are cases where the data read operation overlaps with the data write operation in the same time period. For example, at t5 and t6, the data is written to the memory cell macro MCM1 and the data is read from the memory cell macro MCM3. However, in the third embodiment, no collision occurs between the read data and the write data on the global data buses because the read global data buses RGDB are provided separately from the write global data buses WGDB.

As described above, according to the present embodiment, even the MRAM including the ECC circuits can perform the data read operation and the data write operation in parallel. Therefore, the present embodiment can perform a high-frequency DDR (Double Data Rate) operation.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of bit lines;
a plurality of word lines;
a plurality of memory cells respectively connected to the bit lines and the word lines;
a plurality of sense amplifiers configured to detect data stored in the memory cells via the bit lines;
a row decoder selecting one of the word lines; and
a column decoder selecting one of the bit lines, wherein
after an active command is received by the device at a time when receiving a clock, a read command is received by the device at a time when receiving next clock.

2. The device of claim 1, wherein
the active command is inputted to the row decoder for selecting one of the word lines, and
the read command is inputted to the column decoder for selecting one of the bit lines.

3. The device of claim 2, wherein
the active command and the read command specify one of the word lines which should be driven to operate a read operation.

4. The device of claim 2, wherein
the memory cells respectively include magnetic tunnel junction elements.

5. The device of claim 2, wherein
the memory cells respectively include STT (Spin Transfer Torque)-MTJ elements.

6. The device of claim 5, further comprising:
an ECC circuit configured to correct errors at the time of a read operation.

7. The device of claim 2, further comprising:
an ECC circuit configured to correct errors at the time of a read operation.

8. The device of claim 2, wherein
after the row decoder receives an active command, the column decoder consecutively receives a plurality of read commands.

9. A semiconductor storage device comprising:
a plurality of bit lines;
a plurality of word lines;
a plurality of memory cells respectively connected to the bit lines and the word lines;
a plurality of sense amplifiers configured to detect data stored in the memory cells via the bit lines;
a row decoder selecting one of the word lines; and
a column decoder selecting one of the bit lines, wherein
after an active command is received by the device at a time when receiving a clock, a write command is received by the device at a time when receiving next clock.

10. The device of claim 9, wherein
the active command is inputted to the row decoder for selecting one of the word lines, and
the write command is inputted to the column decoder for selecting one of the bit lines.

11. The device of claim 10, wherein
the active command and the write command specify one of the word lines which should be driven to operate a write operation.

12. The device of claim 10, wherein
the memory cells respectively include magnetic tunnel junction elements.

13. The device of claim 10, wherein
the memory cells respectively include STT (Spin Transfer Torque)-MTJ elements.

14. The device of claim 13, further comprising:
an ECC circuit configured to correct errors at the time of a data read operation.

15. The device of claim 14, wherein
the sense amplifier temporarily reads data in the write operation and updates the data in a writing target column to write data, and
the ECC circuit corrects error on the data in the other columns.

16. The device of claim 10, further comprising:
an ECC circuit configured to correct errors at the time of a read operation.

17. The device of claim 16, wherein
the sense amplifier temporarily reads data in the write operation and updates the data in a writing target column to write data, and
the ECC circuit corrects error on the data in the other columns.

18. A semiconductor storage device comprising:
a plurality of bit lines;
a plurality of word lines;
a plurality of memory cells respectively connected to the bit lines and the word lines;
a plurality of sense amplifiers configured to detect data stored in the memory cells via the bit lines;
a row decoder selecting one of the word lines;
a column decoder selecting one of the bit lines; and
an ECC circuit configured to correct errors at the time of a read operation, wherein
after the row decoder receives an active command for selecting one of the word lines is received by the device at a time when receiving a clock, the column decoder consecutively receives an initial read command for selecting one of the bit lines is received by the device at a time when receiving next clock, and the column decoder consecutively receives a plurality of read commands, after receiving the initial read command.

* * * * *